US007822083B2

United States Patent
Kikuchi

(10) Patent No.: US 7,822,083 B2
(45) Date of Patent: Oct. 26, 2010

(54) LASER LIGHT INTENSITY CONTROL DEVICE, LASER LIGHT INTENSITY CONTROL METHOD, AND IMAGE FORMING APPARATUS

(75) Inventor: Toru Kikuchi, Ibaraki (JP)

(73) Assignee: Ricoh Company, Ltd., Tokyo (JP)

( * ) Notice: Subject to any disclaimer, the term of this patent is extended or adjusted under 35 U.S.C. 154(b) by 93 days.

(21) Appl. No.: 12/357,713

(22) Filed: Jan. 22, 2009

(65) Prior Publication Data

US 2009/0190617 A1 Jul. 30, 2009

(30) Foreign Application Priority Data

Jan. 29, 2008 (JP) .............................. 2008-017968

(51) Int. Cl.
*H01S 3/13* (2006.01)
(52) U.S. Cl. ................................ 372/29.021; 372/29.01
(58) Field of Classification Search .................. 372/34, 372/29.01, 29.011; 345/204; 362/257
See application file for complete search history.

(56) References Cited

U.S. PATENT DOCUMENTS 4,725,854 A * 2/1988 Ohtsuka et al. ............. 347/247
5,392,303 A * 2/1995 Shiozawa et al. ............. 372/32
6,369,926 B1 * 4/2002 Lyu et al. ....................... 398/95
6,845,109 B2 * 1/2005 Lee et al. .................. 372/29.02

FOREIGN PATENT DOCUMENTS

JP 60-234389 11/1985
JP 2002-321402 11/2002

* cited by examiner

*Primary Examiner*—Minsun Harvey
*Assistant Examiner*—Tuan N. Nguyen
(74) *Attorney, Agent, or Firm*—Oblon, Spivak, McClelland, Maier & Neustadt, L.L.P.

(57) ABSTRACT

A disclosed laser light intensity control device includes a semiconductor laser configured to scan a photoconductor by emitting laser beams and form an electrostatic latent image, a temperature detection circuit configured to detect a temperature of the semiconductor laser, a light intensity detection circuit configured to detect a light intensity of the laser beams emitted from the semiconductor laser, a first drive circuit configured to supply the semiconductor laser with a first current that drives the semiconductor laser, a second drive circuit configured to supply the semiconductor laser with a second current that is superimposed on the first current, and a control circuit configured to control the first drive circuit and the second drive circuit.

5 Claims, 7 Drawing Sheets

LASER LIGHT INTENSITY CONTROL DEVICE, LASER LIGHT INTENSITY CONTROL METHOD, AND IMAGE FORMING APPARATUS

BACKGROUND OF THE INVENTION

1. Field of the Invention

The present invention relates to a laser light intensity control device including a semiconductor laser that scans a photoconductor by emitting laser beams and forms an electrostatic latent image, a laser light intensity control method, and an image forming apparatus.

2. Description of the Related Art

Image forming apparatuses using a semiconductor laser as the light source offers an automatic power control (APC) function for achieving a constant laser light intensity in order to provide high quality images with no density variations. When executing the APC function, the laser light intensity is detected using a method that turns on a laser in a non-printing area in a main scanning direction, converts the laser power into electric current using a photodiode, and monitors a voltage generated in a resistor. Then, the detected laser light intensity is compared with a target laser light intensity preset in the image forming apparatuses. If there is a difference between the detected laser light intensity and the target laser light intensity, the drive current of the semiconductor laser is adjusted to bring the laser light intensity close to the target light intensity.

In the image forming apparatuses using a semiconductor laser, if the semiconductor laser is continuously driven to emit light, the laser light intensity decreases. This phenomenon is called droop and is unique to semiconductor lasers. Droop causes density variations in images, resulting in reduced image quality. In order to reduce droop, some related art image forming apparatuses use a method that supplies a predetermined so-called bias current to a semiconductor laser to keep the semiconductor driving without emitting laser beams and, at the time of image formation, superimposes a current responsive to a modulation signal on the bias current to cause the semiconductor laser to emit light.

The related art image forming apparatuses using this method can provide improved responsiveness for causing the light emission time of the semiconductor laser to respond to the modulation signal which indicates ON time of the semiconductor laser. Japanese Patent Laid-Open Publication No. 60-234389 teaches the effects of bias current on the responsiveness of semiconductor lasers.

In order to achieve a constant laser light intensity, other related art image forming apparatuses use a method that divides a current for driving a semiconductor laser into a light emission current and a bias current which are independent from each other and sets the bias current based on measurements of the slope efficiency. For example, Japanese Patent Laid-Open Publication No. 2002-321402 discloses a method that maintains a constant laser light intensity with a fixed light emission current and a variable bias current using an APC function.

In recent years, the above described image forming apparatuses using a semiconductor laser have been expected to provide higher printing speed and better image quality. To satisfy such a demand, image forming apparatuses having a multibeam light source formed of plural semiconductor lasers have been put into practical use.

The image forming apparatuses having a multibeam light source are required to control the laser light intensity more precisely in order to achieve a constant light intensity of each beam and to equalize the light intensities of the beams.

SUMMARY OF THE INVENTION

In view of the foregoing, the present invention is directed toward providing a laser light intensity control device, a laser light intensity control method, and an image forming apparatus that are capable of controlling the laser light intensity with high accuracy and maintaining stable operation of a laser light source.

In an embodiment of the present invention, there is provided a laser light intensity control device that includes a semiconductor laser configured to scan a photoconductor by emitting laser beams and form an electrostatic latent image, a temperature detection circuit configured to detect a temperature of the semiconductor laser, a light intensity detection circuit configured to detect a light intensity of the laser beams emitted from the semiconductor laser, a first drive circuit configured to supply the semiconductor laser with a first current that drives the semiconductor laser, a second drive circuit configured to supply the semiconductor laser with a second current that is superimposed on the first current, and a control circuit configured to control the first drive circuit and the second drive circuit. The control circuit includes a current setting unit configured to set the first current and the second current based on the light intensity of the laser beams detected by the light intensity detection circuit, a fluctuation range determining unit configured to determine an allowable fluctuation range of the temperature of the semiconductor laser detected by the temperature detection circuit, and a temperature fluctuation determining unit configured to determine whether fluctuation of the temperature of the semiconductor laser is beyond the allowable fluctuation range upon formation of the electrostatic latent image after the first current and the second current are set by the current setting unit. If the temperature fluctuation determining unit determines that fluctuation of the temperature of the semiconductor laser is beyond the allowable fluctuation range, the current setting unit resets the first current and the second current.

This laser light intensity control device can control the laser light intensity with high accuracy and maintain stable operation of the semiconductor laser light source.

In another embodiment of the present invention, there is provided an image forming apparatus that includes the above described laser light intensity control device.

In still another embodiment of the present invention, there is provided a laser light intensity control method for use in a laser light intensity control device including a semiconductor laser that scans a photoconductor by emitting laser beams and forms an electrostatic latent image. The method includes a temperature detecting step of detecting a temperature of the semiconductor laser, a light intensity detecting step of detecting a light intensity of the laser beams emitted from the semiconductor laser, a first driving step of supplying the semiconductor laser with a first current that drives the semiconductor laser, a second driving step of supplying the semiconductor laser with a second current that is superimposed on the first current, and a controlling step of controlling the first driving step and the second driving step. The controlling step includes a current setting step of setting the first current and the second current based on the light intensity of the laser beams detected in the light intensity detecting step, a fluctuation range determining step of determining an allowable fluctuation range of the temperature of the semiconductor laser detected in the temperature detecting step, and a temperature fluctuation determining step of determining whether fluctuation of the temperature of the semiconductor laser is beyond the allowable fluctuation range upon formation of the electrostatic latent image after the first current and the second current are set in the current setting step. If fluctuation of the temperature of the semiconductor laser is determined to be beyond the allowable fluctuation range in the temperature fluctuation determining step, the first current and the second current are reset.

This method can control the laser light intensity with high accuracy and maintain stable operation of the semiconductor laser light source.

According to an aspect of the present invention, it is possible to control the laser light intensity with high accuracy and maintain stable operation of the semiconductor laser light source.

DETAILED DESCRIPTION OF THE PREFERRED EMBODIMENT

Figure 1:
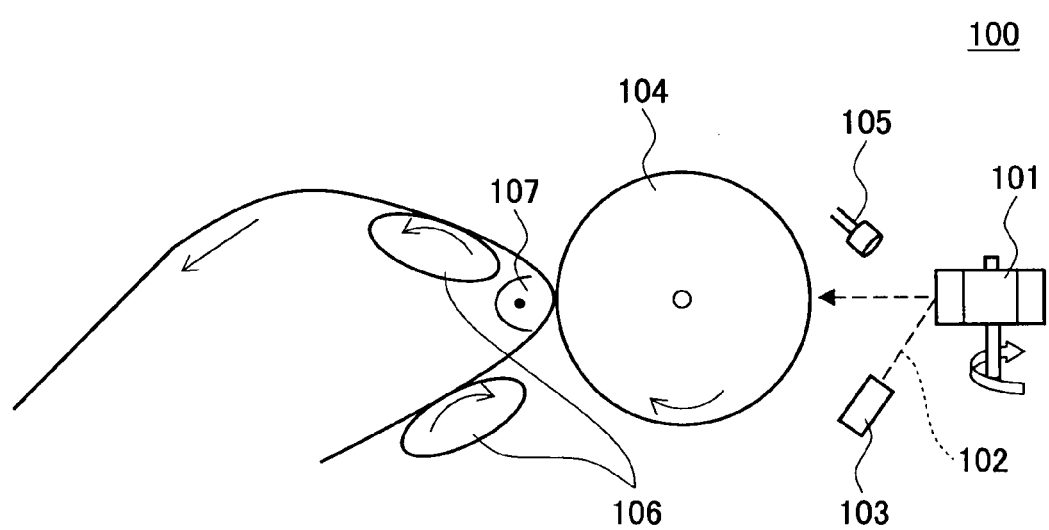
FIG. 1 is a diagram for explaining an image forming apparatus according to an embodiment of the present invention.

According to an embodiment of the present invention, a bias current as a first current and a superimposed current as a second current are independently set, and the bias current is adjusted to maintain a constant laser light intensity during image formation. If temperature fluctuation of a semiconductor laser exceeds an allowable range during image formation, the bias current and the superimposed current are reset while image formation is not performed.

Before describing a preferred embodiment of the present invention, problems to be solved by the present invention are discussed in detail below. Note that, in the following description, a bias current corresponds to a first current in the appended claims, and a superimposed current corresponds to a second current in the appended claims. The superimposed current is superimposed on the bias current according to a modulation signal. The superimposed current is a current obtained by adding an offset current, which prevents the semiconductor laser from emitting light when the bias current is applied to the semiconductor laser, to a light emission current, which causes a semiconductor laser to emit light. The light emission current and the offset current are described below in greater detail.

According to the above described method that superimposes a superimposed current (light emission current) to cause a semiconductor laser to emit light, which is used in some related art image forming apparatuses, it is preferable to make the bias current less than but as close to a threshold current as possible. The threshold current as used herein refers to a current required to cause the semiconductor laser to emit light.

The threshold current of the semiconductor laser is however temperature dependent and therefore fluctuates in response to ambient temperature and the temperature of the semiconductor laser which fluctuates due to self-heating. If the bias current is increased to exceed the threshold current, the semiconductor laser emits light regardless of the modulation signal. This causes background noise, which prevents reduction of droop. On the other hand, if the bias current is reduced to be away from the threshold current, the responsiveness of the semiconductor laser is negatively affected. This causes abnormal dots and density variations, which results in reduced image quality.

That is, in order to reduce droop while maintaining the responsiveness of the semiconductor laser, it is preferable to set the bias current and the superimposed current according to the threshold current dependent on the temperature fluctuation of the semiconductor laser.

However, the bias current and the superimposed current are set based on the slope efficiency (described below), and hence it takes time to set the bias current and the superimposed current. In the case of multibeam beam light sources, the bias current and the superimposed current need to be set for each beam, and hence it takes a longer time to set the bias current and the superimposed current for all the beams. Therefore, the bias current and the superimposed current cannot be set during image formation, and hence it is sometimes necessary to interrupt image formation in order to maintain the image quality.

Suspension of image formation reduces not only the operating rate of the image forming apparatus but also the print speed. Therefore, it is preferable to reset the bias current and the superimposed current without interrupting image formation.

Taking the above into consideration, in order to control the laser light intensity in the image forming apparatuses having a multibeam light source more quickly and accurately, it is necessary to control the bias current and the superimposed current according to the threshold current which fluctuates with the temperature fluctuation of the semiconductor laser. In the case of the method that causes a semiconductor laser to emit light with a fixed superimposed current and an adjustable bias current, it is necessary to control the bias current according to the threshold current of the semiconductor laser.

An image forming apparatus of the following embodiment of the present invention determines whether to reset the bias current and the superimposed current based on temperature fluctuation of a semiconductor laser in a short cycle associated with scanning by the semiconductor laser in a main scanning direction. In the following embodiment, this configuration makes it possible to control the bias current according to fluctuation of the threshold current of the semiconductor laser. Note that, in the following embodiment, the method that causes a semiconductor laser to emit light with a fixed superimposed current and an adjustable bias current is applied.

Embodiment

The following describes a preferred embodiment of the present invention with reference to the accompanying drawings.

This embodiment illustrates the case where the present invention is applied specifically to an image forming apparatus 100 that outputs images on continuous form paper formed of plural connected pages. FIG. 1 is a diagram for explaining the image forming apparatus 100 according to this embodiment of the present invention.

The image forming apparatus 100 includes a polygon mirror 101, a laser light source (also referred to as a semiconductor laser) 103 that emits laser beams 102, a photoconductor drum 104, a photosensor 105, tractors 106, and a transfer unit 107. The laser light source 103 emits the multiple laser beams 102 onto the photoconductor drum 104 under the control of a below described laser light intensity control unit 200 (see FIG. 2).

The laser beams 102 are reflected by the polygon mirror 101 rotating at a constant speed, scan the photoconductor drum 104 in the horizontal direction, and form an output image (electrostatic latent image) on the photoconductor drum 104 rotating at a constant speed. The photosensor 105 is disposed on the scanning line of the laser beams 102 and detects the laser beams 102 emitted on the photoconductor drum 104 to output a BD (Beam Detect) signal. The image forming apparatus 100 writes out image data based on a vertical signal synchronized with the BD signal, thereby properly outputting image data within a page. Note that the BD signal is a position signal indicating the start position of horizontal scanning of laser beams, and the vertical signal is a control signal for controlling write-out of image data by laser beams in the vertical direction.

Figure 2:
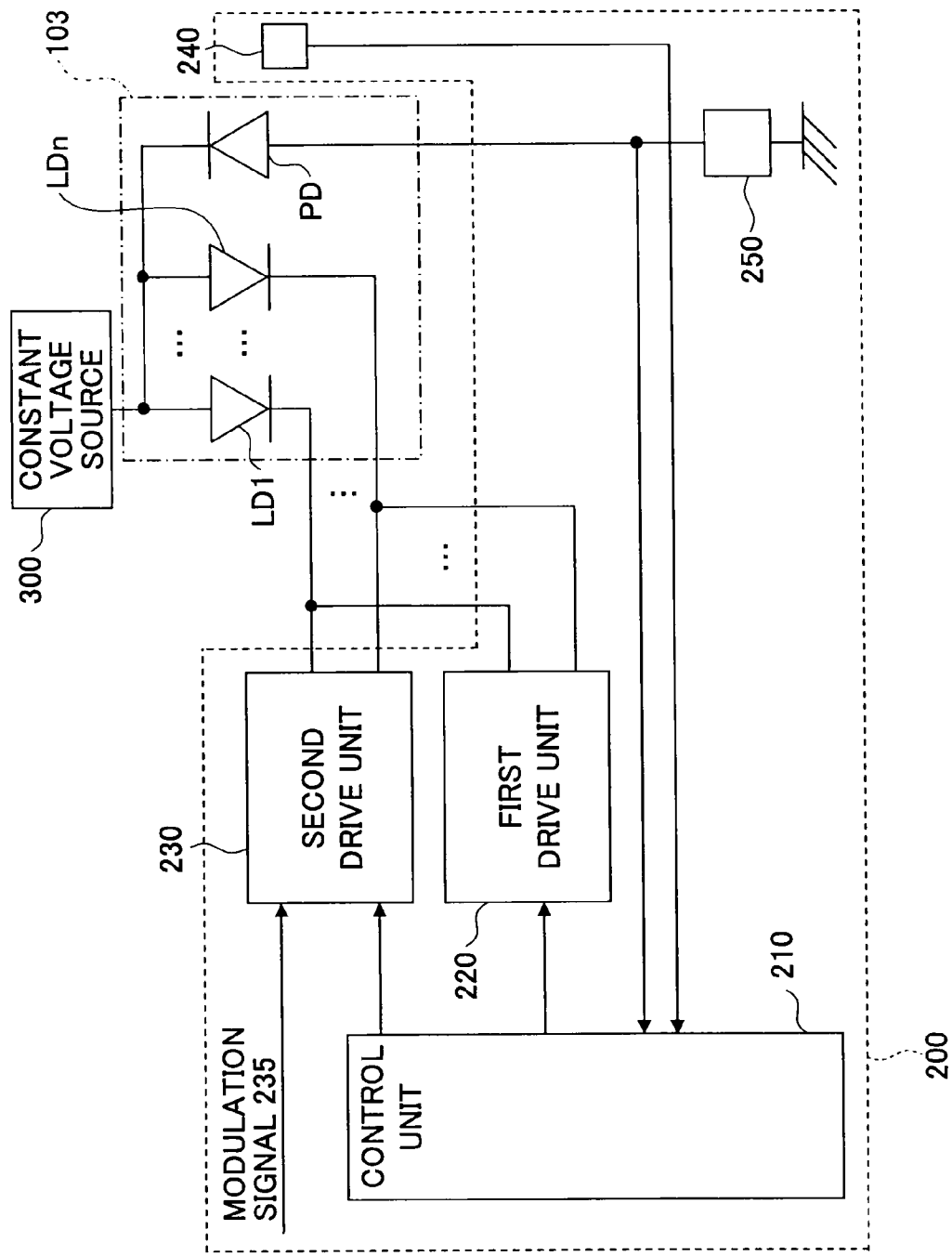
FIG. 2 is a diagram for explaining a laser light intensity control unit that controls a laser light source.

FIG. 2 is a diagram for explaining the laser light intensity control unit 200 that controls the laser light source 103.

The laser light source 103 includes plural laser diodes LD1-LDn and a photodiode PD and is controlled by the laser light intensity control unit 200. Anodes of the laser diodes LD1-LDn and a cathode of the photodiode PD are connected to a constant voltage source 300 from which a power supply voltage is supplied thereto. Cathodes of the laser diodes LD1-LDn are connected to a first drive unit 220 and a second drive unit 230 (both described below). The laser diodes LD1-LDn emit light upon supply of a total current of a bias current, which is supplied from the first drive unit 220, and a superimposed current, which is supplied from the second drive unit 230.

The laser light intensity control unit 200 includes a control unit 210, the first drive unit 220, the second drive unit 230, a thermistor 240, and a resistor 250. The control unit 210 controls the laser light intensity control unit 200, and mainly controls the first drive unit 220 and the second drive unit 230. The function of the control unit 210 is described below in greater detail.

The first drive unit 220 supplies the bias current set by the control unit 210 to the laser diodes LD1-LDn. Supply and supply stop of the bias current by the first drive unit 220 are controlled by the control unit 210.

The second drive unit 230 supplies the superimposed current set by the control unit 210 to the laser diodes LD1-LDn. Supply and supply stop of the superimposed current by the second drive unit 230 are controlled by the control unit 210 and a modulation signal 235 supplied to the second drive unit 230. Note that the modulation signal 235 may be supplied, in accordance with image formation operations, to the second drive unit 230 from, for example, a main body control unit (not shown) for controlling the main body of the image forming apparatus 100 having the laser light intensity control unit 200.

The thermistor 240 is a temperature detecting unit for detecting the temperature of the semiconductor laser 103. The thermistor 240 is mounted on the semiconductor laser 103 and is connected to the control unit 210. The control unit 210 monitors the temperature of the semiconductor laser 103 based on a voltage converted from a resistance change of the thermistor 240. A circuit for converting a resistance change of the thermistor 240 into a voltage is well known and therefore is not shown in the drawings.

The resistor 250 is a light intensity detecting unit for detecting the light intensity of the semiconductor laser 103. The resistor 250 has an end connected to an anode of the photodiode PD and the control unit 210, and the other end connected to a reference voltage (ground). The control unit 210 monitors the light intensity of the laser beams 102 of the semiconductor laser 103 based on a voltage converted by the resistor 250 from a photocurrent that is proportional to the light intensity of the lasers generated by the photodiode PD.

Figure 3:
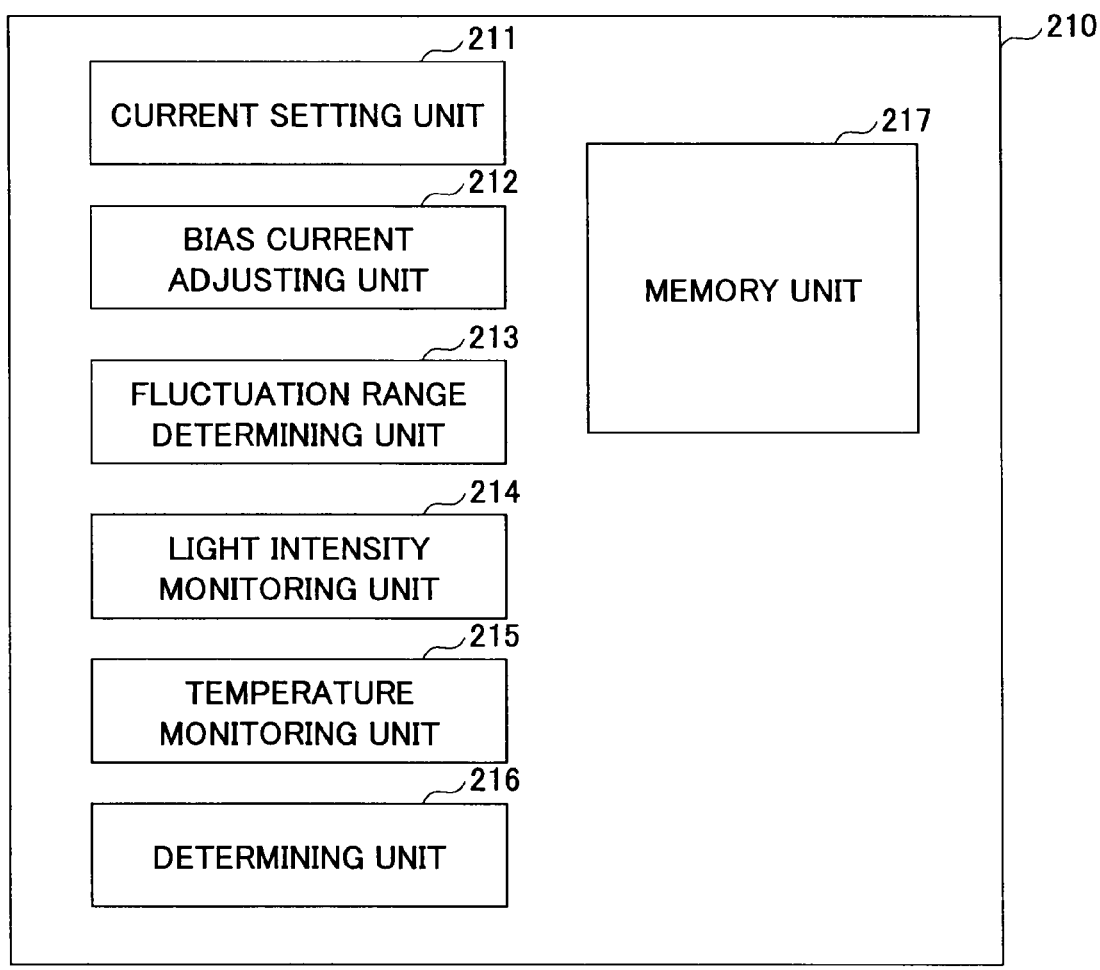
FIG. 3 is a diagram for explaining the functional configuration of a control unit of the laser light intensity control unit.

Next, the control unit 210 of the laser light intensity control unit 200 of this embodiment is described in detail with reference to FIG. 3. FIG. 3 is a diagram for explaining the functional configuration of the control unit 210 of the laser light intensity control unit 200.

The control unit 210 of the laser light intensity control unit 200 of this embodiment includes a current setting unit 211, a bias current adjusting unit 212, a fluctuation range determining unit 213, a light intensity monitoring unit 214, a temperature monitoring unit 215, a determining unit 216, and a memory unit 217. The control unit 210 of this embodiment may be a microprocessor, for example, and includes an arithmetic processing unit and a storage unit. The arithmetic processing unit reads and executes a program stored in the storage unit to provide the functions of the current setting unit 211, the bias current adjusting unit 212, the fluctuation range determining unit 213, the light intensity monitoring unit 214, the temperature monitoring unit 215, and the determining unit 216 of the control unit 210. The memory unit 217 is a storage area in the storage unit.

The current setting unit 211 sets a bias current and a superimposed current to be supplied from the first drive unit 220 and the second drive unit 230, respectively, to the laser diode LD1-LDn. More specifically, the current setting unit 211 calculates the setting values of the bias current and the superimposed current using a method described below and stores the setting values in the memory unit 217, thereby setting the bias current and the superimposed current.

The bias current adjusting unit 212 adjusts the bias current set by the current setting unit 211. Adjustment of the bias current is described below in greater detail. The fluctuation range determining unit 213 determines the allowable range of temperature fluctuation of the semiconductor laser 103. More specifically, the fluctuation range determining unit 213 determines the allowable fluctuation range using a method described below and stores the allowable fluctuation range in the memory unit 217, thereby determining the allowable fluctuation range.

The light intensity monitoring unit 214 monitors the light intensity of the light emitted from the laser diodes LD1-LDn that is detected by the resistor 250. The temperature monitoring unit 215 monitors the temperature of the semiconductor laser 103 detected based on the resistance change of the thermistor 240. The determining unit 216 determines whether fluctuation of the temperature monitored by the temperature monitoring unit 215 is beyond the allowable fluctuation range determined by the fluctuation range determining unit 213.

The memory unit 217 stores values necessary for operations by the above described units, values set or detected by the above described units, and the like.

Operations of the image forming apparatus 100 of this embodiment are described below. In the image forming apparatus 100 of this embodiment, determination by the determining unit 216 is performed in conjunction with scanning by the semiconductor laser 103 in a main scanning direction during image formation. More specifically, in the image forming apparatus 100 of this embodiment, each time the semiconductor laser 103 moves one line in the main scanning direction, the determining unit 216 determines whether temperature fluctuation of the semiconductor laser 103 is within the allowable fluctuation range in a non-printing area. If the temperature fluctuation of the semiconductor laser 103 is outside the allowable fluctuation range, the current setting unit 211 resets the bias current and the superimposed current.

Figure 4:
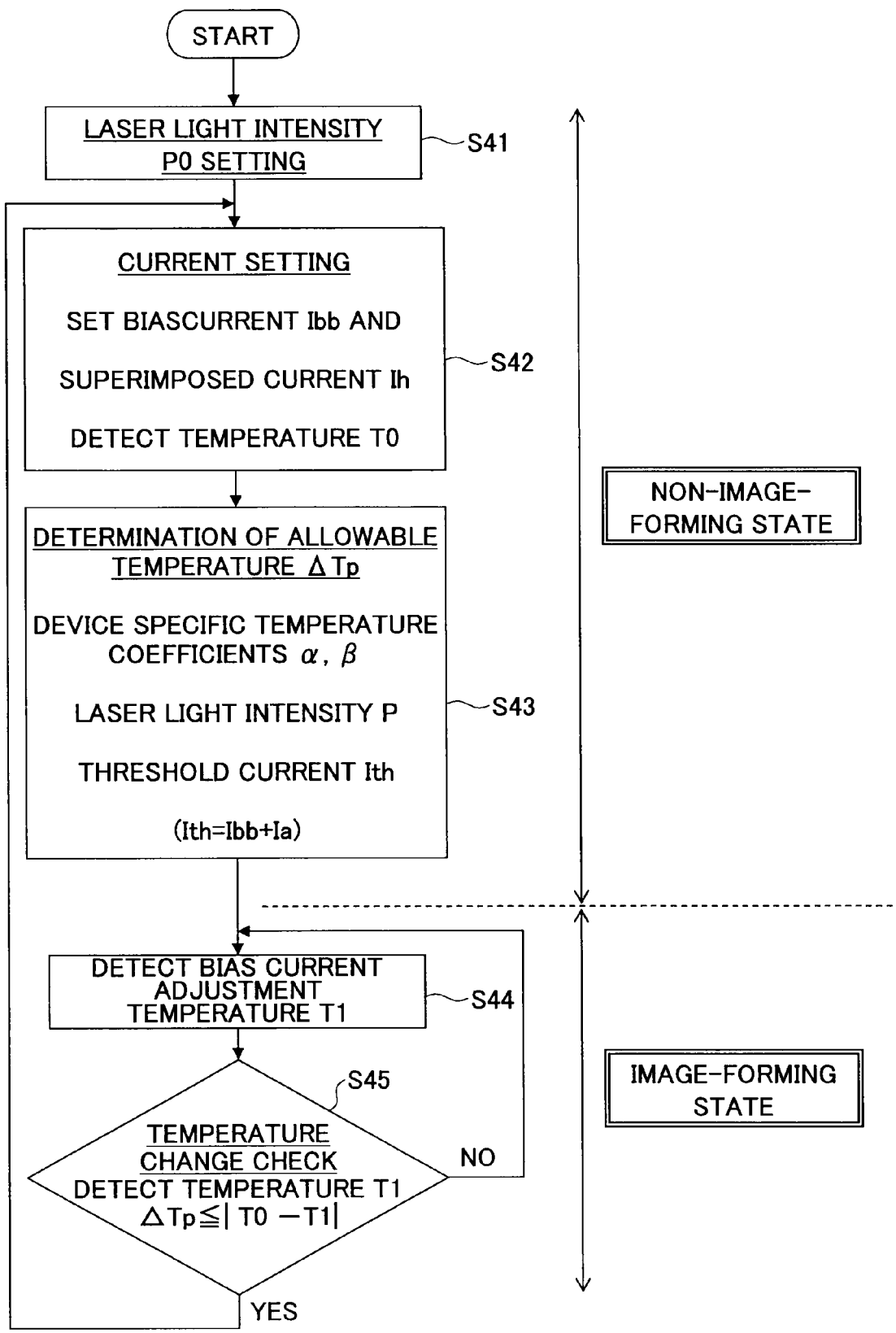
FIG. 4 is a flowchart illustrating operations of the image forming apparatus according to an embodiment.

FIG. 4 is a flowchart illustrating the operations of the image forming apparatus 100 of this embodiment. In the control unit 210 of this embodiment, a target value P0 of the laser light intensity is preset in the memory unit 217 (Step S41). Then, when image formation is not performed (non-image-forming state), the control unit 210 causes the current setting unit 211 to set a bias current Ibb and a superimposed current Ih (Step S42). The temperature monitoring unit 215 stores, in the memory unit 217, a temperature T0 that is detected based on a resistance change of the thermistor 240 when the current setting is performed by the current setting unit 211. The current setting operation in Step S42 is described below in greater detail.

Then, the fluctuation range determining unit 213 calculates and determines an allowable range ΔTp of temperature fluctuation of the semiconductor laser 103 (Step S43). The allowable range ΔTp is calculated based on temperature coefficients specific to the image forming apparatus 100, the target value P0 of the laser light intensity set in Step S41, and a threshold current of the semiconductor laser 103 calculated in Step S42. Calculation of the allowable range ΔTp in Step S43 is described below in greater detail.

The image forming apparatus 100 executes the operations from Step S41 to Step S43 in the non-image-forming state. When the bias current Ibb, the superimposed current Ih, and the allowable range ΔTp are determined, the image forming apparatus 100 performs image formation (image-forming state).

When the image forming apparatus 100 is in the image-forming state, the bias current adjusting unit 212 detects the laser light intensity of the semiconductor laser 103, which is monitored by the light intensity monitoring unit 214, each time the semiconductor laser 103 scans one line in the main scanning direction. Then, the bias current adjusting unit 212 compares the detected laser light intensity with the target value P0 and adjusts the bias current Ibb to bring the laser light intensity of the semiconductor laser 103 close to the target value P0 (S44). In this embodiment, the value of the superimposed current Ih is fixed. Adjustment of the bias current Ibb in Step S44 is described below in greater detail. The temperature monitoring unit 215 stores, in the memory unit 217, a temperature T1 of the semiconductor laser 103 that is detected based on a resistance change of the thermistor 240 when the bias current Ibb is adjusted.

The determining unit 216 determines whether the difference (T0−T1) between the temperature T0 stored in the memory unit 217 in Step S42 and the temperature T1 stored in the memory unit 217 in Step S44 is beyond the allowable range ΔTp (Step S45). In Step S45, if the difference (T0−T1) is equal to or greater than the allowable range ΔTp, the control unit 210 shifts the laser light intensity control unit 200 into the non-image-forming state and resets the bias current Ibb and the superimposed current Ih in step S42. On the other hand, if the difference (T0−T1) is less than the allowable range ΔTp, the control unit 210 maintains the image-forming state.

In this embodiment, as described above, since the resetting of the bias current Ibb and the superimposed current Ih is performed depending on temperature fluctuation of the semiconductor laser 103, it is possible to make the bias current Ibb less than the threshold current but as close to the threshold current as possible. That is, according to this embodiment, it is possible to improve the responsiveness of the semiconductor laser 103 and reduce droop, and therefore it is possible to control the laser light intensity with high accuracy and maintain stable operation of the semiconductor laser 103.

Figure 5:
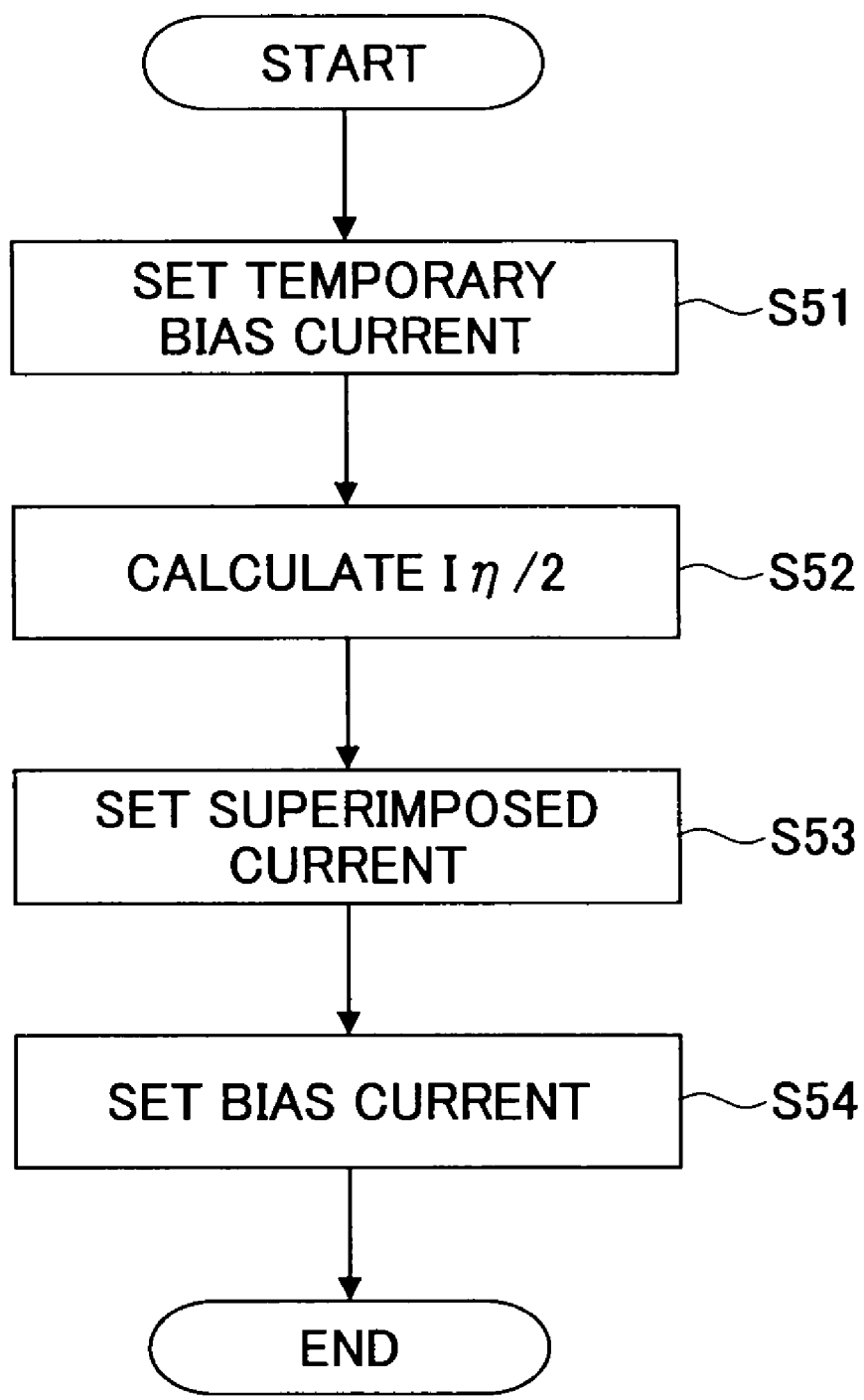
FIG. 5 is a flowchart illustrating a bias current setting operation by a current setting unit of the control unit.
Figure 6:
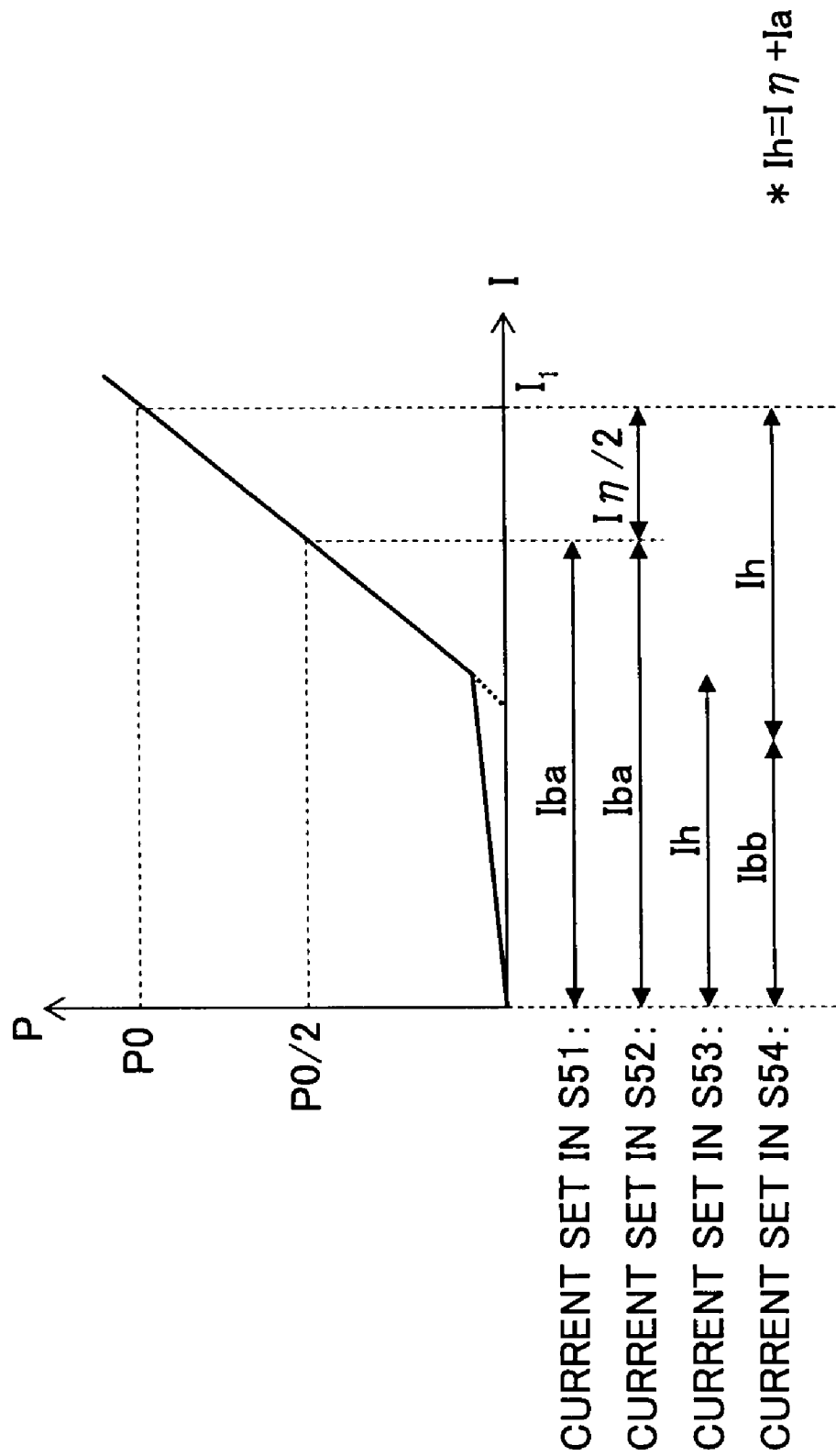
FIG. 6 is a diagram for explaining setting of a bias current and a superimposed current.

The operation in each step illustrated in FIG. 4 is described below in greater detail. First, the operation in Step S42 is described with reference to FIGS. 5 and 6. FIG. 5 is a flowchart illustrating the bias current setting operation by the current setting unit 211 of the control unit 210. FIG. 6 is a diagram for explaining setting of the bias current Ibb and the superimposed current Ih.

In the control unit 210 of this embodiment, the current setting unit 211 measures a slope efficiency of the semiconductor laser 103 based on the target value P0 of the laser light intensity preset in Step S41 of FIG. 4 and a relationship (I-P properties) between a drive current and the laser light intensity of the semiconductor laser 103, and calculates the bias current Ibb and the superimposed current Ih.

The current setting unit 211 drives, while the light intensity monitoring unit 214 monitors the laser light intensity, the first drive unit 220 to make the laser light intensity equal to P0/2, which is half the light intensity of the target value P0. Then, the current setting unit 211 sets, as a temporary bias current Iba, a current that is supplied to the laser diodes LD1-LDn when the light intensity detected by the light intensity monitoring unit 214 becomes P0/2, and stores the temporary bias current Iba in the memory unit (Step S51).

Then, the current setting unit calculates a light emission current Iη/2 (Step S52). The light emission current Iη is a current that can cause the laser diodes LD1-LDn to emit light when added to the temporary bias current Iba. The current setting unit 211 drives, while the light intensity monitoring unit 214 monitors the laser light intensity, the second drive unit 230 to make the laser light intensity equal to P0 with a total current I1 of a current supplied from the first drive unit 220 and a current supplied from the second drive unit 230. Then, the current setting unit 211 sets, as Iη/2, a value obtained by subtracting the temporary bias current Iba from the current I1 that is supplied to the laser diodes LD1-LDn when the light intensity becomes P0 and stores the value in the memory unit 217 (Step S51).

The current setting unit 211 sets the superimposed current Ih based on Iη/2 calculated in Step S52 (Step S53). The current setting unit 211 sets, as a superimposed current Ih, a current obtained by adding an offset current Ia to the light emission current Iη, which is twice Iη/2 (Step S53). Note that the offset current Ia is added as a margin that prevents the semiconductor laser 103 from emitting light when the modulation signal is off. The value of the offset current Ia is preset based on experimental values or the like and may be stored in the memory unit 217.

When the superimposed current Ih is set, the current setting unit 211 sets the bias current Ibb based on the superimposed current Ih (Step S54). The current setting unit 211 sets a current obtained by subtracting the current I1 that makes the laser light intensity equal to the target value P0 from superimposed current Ih set in the Step S53.

In this embodiment, the bias current Ibb and the superimposed current Ih are set as described above. The value of the superimposed current Ih set in this embodiment is fixed. FIG. 6 shows the currents set in Step S51-S54 of FIG. 5. In FIG. 6, the horizontal axis indicates the laser drive current and the vertical axis indicates the laser light intensity.

Next, determination of the allowable range ΔTp by the fluctuation range determining unit 213 in Step S43 of FIG. 4 is described.

In the image forming apparatus 100 of this embodiment, the relationship between the laser light intensity of the semiconductor laser 103, the slope efficiency, the threshold current of the semiconductor laser 103, and the laser drive current Iop of the semiconductor laser 103 is represented by the following expressions (1) and (2):

$$P = \eta \cdot I\eta \quad \text{Expression (1)}$$

$$I\eta = Iop - Ith \quad \text{Expression (2)}$$

where P is the laser light intensity of the semiconductor laser 103, η is the slope efficiency, Ith is the threshold current of the semiconductor laser 103, and Iop is the laser drive current of the semiconductor laser 103. Note that since the point where the laser light intensity is P0/2 and the point where the laser light intensity is P are measured (S51 and S52 of FIG. 5), the slope efficiency is calculated from these two points.

The effect of the temperature change is represented by the following approximate expressions (3) and (4):

$$\eta(\Delta T) = \eta 0 \cdot (1 + \alpha \cdot \Delta T) \quad \text{Expression (3)}$$

$$Ith(\Delta T) = Ith0 \cdot (1 + \beta \cdot \Delta T) \quad \text{Expression (4)}$$

where ΔT is the temperature change, α is the rate of temperature change of the slope efficiency η, and β is the rate of temperature change of the threshold current Ith.

Here, η0 is the slope efficiency when the temperature change ΔT is 0, and Ith0 is the threshold current when the temperature change ΔT is 0. The temperature changes of the slope efficiency and the threshold current are represented by exponential function expressions, but it is believed that straight line approximations can be used when ΔT is small.

In this embodiment, the effect of the temperature fluctuation on the laser light intensity of the semiconductor laser 103 can be represented by the following expression (5) using the expressions (1)-(4):

$$P(\Delta T) - P0 = (P0 \cdot \alpha - Ith0 \cdot \beta) \cdot \Delta T \quad \text{Expression (5)}$$

where α and β are device-specific temperature coefficients, and P0 is the preset target value of the laser light intensity. The threshold current Ith of the semiconductor laser 103 is a total current of the bias current Ibb in Step S42 of FIG. 4 and the offset current Ia.

That is, when the allowable range of laser light intensity fluctuation due to temperature fluctuation of the semiconductor laser 103 is known in advance, the allowable range ΔTp of the temperature fluctuation of the semiconductor laser 103 can be calculated based on the expression (5). In this embodiment, the effect of the temperature fluctuation on the laser light intensity is represented by a ratio (Ibb/Ith) between the threshold current Ith, which fluctuates according to the temperature fluctuation of the semiconductor laser 103, and the bias current Ibb set by the current setting unit 211.

The threshold current Ith of the semiconductor laser 103 fluctuates according to the temperature of the semiconductor laser 103 in the image-forming state. On the other hand, the bias current Ibb and the superimposed current Ih that causes the semiconductor laser 103 to emit light have values set in the non-image-forming state. Accordingly, Ibb/Ith fluctuates according to the temperature fluctuation of the semiconductor laser 103.

If the threshold current Ith increases, Ibb/Ith decreases, which may result in droop and reduced responsiveness. If the threshold current Ith decreases, Ibb/Ith increases. When Ibb/Ith is equal to or greater than 1, there is a risk of exposure in the non-printing area. In this way, Ibb/Ith represents the laser quality in this embodiment. The quality of laser emission is maintained constant by maintaining the value of Ibb/Ith constant.

In this embodiment, the initial setting value of Ibb/Ith is 0.8, and Ibb/Ith is set to be in a range of 0.7-0.9. That is, the fluctuation range determining unit 213 of this embodiment calculates the allowable range ΔTp that makes Ibb/Ith be in the range of 0.7-0.9.

Figure 7:
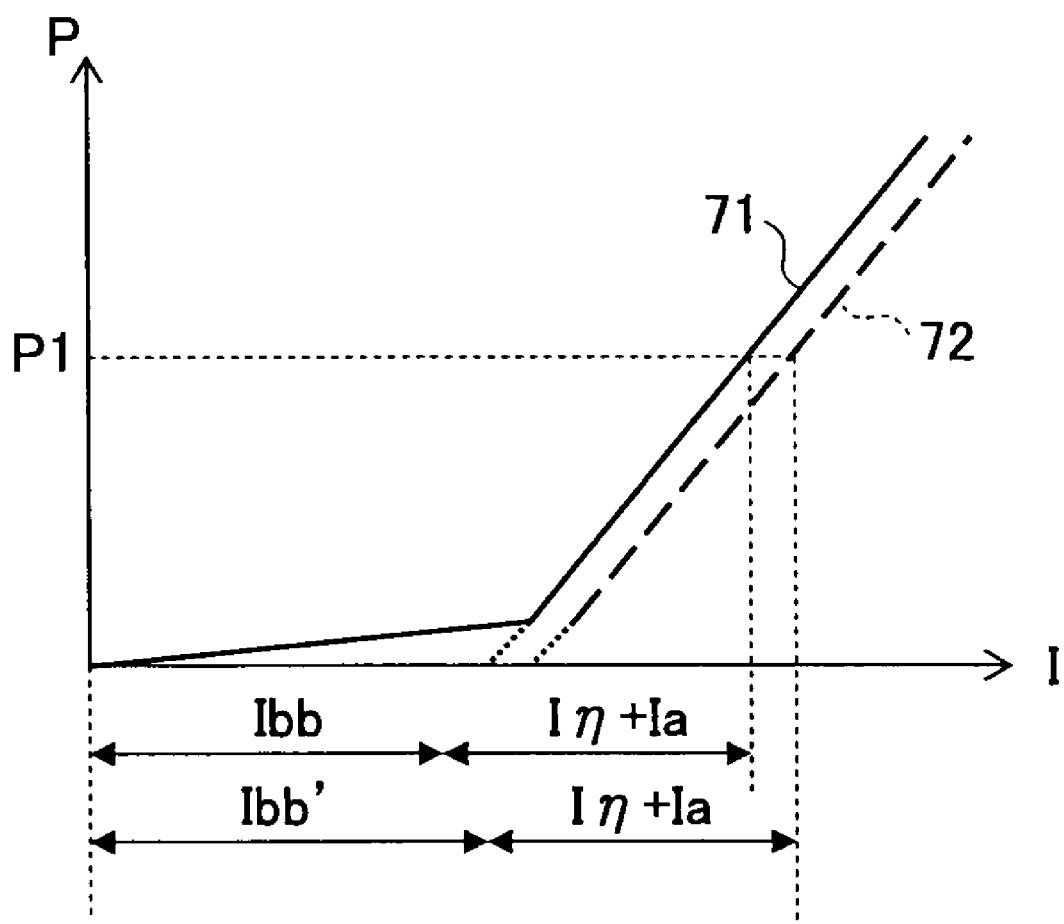
FIG. 7 is a diagram for explaining adjustment of a bias current.

Next, adjustment of the bias current Ibb by the bias current adjusting unit 212 in Step S44 of FIG. 4 is described. FIG. 7 is a diagram for explaining adjustment of the bias current Ibb.

The threshold current Ith representing a drive current for causing the semiconductor laser 103 to start laser emission and the slope efficiency representing gain of conversion from the drive current to a laser light intensity vary depending on the temperature of the semiconductor laser 103 and due to degradation over time.

In FIG. 7, a solid line 71 laser represents the laser light intensity before change, and a dashed line 72 represents the laser light intensity after change. Before change, the semiconductor laser 103 outputs a laser light intensity P1 with a total current of the bias current Ibb and the superimposed current Ih (the light emission current Iη+the offset current Ia).

When the slope efficiency of the laser light intensity of the semiconductor laser 103 is changed from the solid line 71 to the dashed line 72, the laser light intensity P1 is maintained by adjusting the bias current Ibb to a bias current Ibb' without changing the superimposed current Ih. In this embodiment, since the bias current Ibb is adjusted in this manner, it is possible to improve the responsiveness of the semiconductor laser 103 to the modulation signal.

As described above, according to this embodiment, even an image forming apparatus having a multilaser light source can improve the responsiveness of a semiconductor laser and reduce droop, and therefore it is possible to control the laser light intensity with high accuracy and maintain stable operation of the semiconductor laser.

Although the present invention is described with reference to the preferred embodiment, the requirements described in the embodiment do not limit the present invention. These requirements can be modified without departing from the scope of the invention and can be properly determined according to application purposes.

The present application is based on Japanese Priority Application No. 2008-017968 filed on Jan. 29, 2008, with the Japanese Patent Office, the entire contents of which are hereby incorporated herein by reference.

What is claimed is:

1. A laser light intensity control device, comprising:
   a semiconductor laser configured to scan a photoconductor by emitting laser beams and form an electrostatic latent image;
   a temperature detection circuit configured to detect a temperature of the semiconductor laser;
   a light intensity detection circuit configured to detect a light intensity of the laser beams emitted from the semiconductor laser;
   a first drive circuit configured to supply the semiconductor laser with a first current that drives the semiconductor laser;
   a second drive circuit configured to supply the semiconductor laser with a second current that is superimposed on the first current; and a control circuit configured to control the first drive circuit and the second drive circuit, the control circuit including:
- a current setting unit configured to set the first current and the second current based on the light intensity of the laser beams detected by the light intensity detection circuit;
- a fluctuation range determining unit configured to determine an allowable fluctuation range of the temperature of the semiconductor laser detected by the temperature detection circuit; and
- a temperature fluctuation determining unit configured to determine whether fluctuation of the temperature of the semiconductor laser is beyond the allowable fluctuation range upon formation of the electrostatic latent image after the first current and the second current are set by the current setting unit;

wherein, if the temperature fluctuation determining unit determines that fluctuation of the temperature of the semiconductor laser is beyond the allowable fluctuation range, the current setting unit resets the first current and the second current.

2. The laser light intensity control device as claimed in claim 1, wherein the allowable fluctuation range determining unit determines the allowable fluctuation range based on the first current and the second current that are set by the current setting unit and the laser beam intensity that is detected by the light intensity detection circuit based on the first current and the second current.

3. The laser light intensity control device as claimed in claim 1, wherein the control circuit further includes a first current adjusting unit configured to adjust the first current based on the light intensity detected by the light intensity detection circuit during the formation of the electrostatic latent image by the semiconductor laser such that a total current of the first current and the second current has a predetermined current value.

4. An image forming apparatus, comprising:
the laser light intensity control device of claim 1.

5. A laser light intensity control method for use in a laser light intensity control device including a semiconductor laser that scans a photoconductor by emitting laser beams and forms an electrostatic latent image, the method comprising:
- a temperature detecting step of detecting a temperature of the semiconductor laser;
- a light intensity detecting step of detecting a light intensity of the laser beams emitted from the semiconductor laser;
- a first driving step of supplying the semiconductor laser with a first current that drives the semiconductor laser;
- a second driving step of supplying the semiconductor laser with a second current that is superimposed on the first current; and
- a controlling step of controlling the first driving step and the second driving step, the controlling step including:
  - a current setting step of setting the first current and the second current based on the light intensity of the laser beams detected in the light intensity detecting step;
  - a fluctuation range determining step of determining an allowable fluctuation range of the temperature of the semiconductor laser detected in the temperature detecting step; and
  - a temperature fluctuation determining step of determining whether fluctuation of the temperature of the semiconductor laser is beyond the allowable fluctuation range upon formation of the electrostatic latent image after the first current and the second current are set in the current setting step;

wherein, if fluctuation of the temperature of the semiconductor laser is determined to be beyond the allowable fluctuation range in the temperature fluctuation determining step, the first current and the second current are reset.

* * * * *